United States Patent [19]

Levitan

[11] Patent Number: 5,796,758
[45] Date of Patent: Aug. 18, 1998

[54] SELF-CHECKING CONTENT-ADDRESSABLE MEMORY AND METHOD OF OPERATION FOR DETECTING MULTIPLE SELECTED WORD LINES

[75] Inventor: David Stephen Levitan, Austin, Tex.

[73] Assignee: International Business Machines Corporation, Armonk, N.Y.

[21] Appl. No.: 727,334

[22] Filed: Oct. 8, 1996

[51] Int. Cl.$^6$ ............................ G06F 11/10; H03M 13/00
[52] U.S. Cl. .................. 371/49.1; 371/21.1; 371/49.2; 371/49.3
[58] Field of Search ........................ 371/49.1, 49.2, 371/48, 21.1, 22.1, 22.5; 365/49.3, 201, 185.23

[56] References Cited

U.S. PATENT DOCUMENTS

| | | | |
|---|---|---|---|
| 3,789,204 | 1/1974 | Barlow | 235/153 M |
| 4,680,760 | 7/1987 | Giles et al. | 371/21 |
| 5,319,589 | 6/1994 | Yamagata et al. | 365/49 |
| 5,491,703 | 2/1996 | Barnaby et al. | 371/40.1 |

FOREIGN PATENT DOCUMENTS 4-325997  11/1992  Japan .

*Primary Examiner*—Phung M. Chung
*Attorney, Agent, or Firm*—Joseph C. Redmond, Jr.; Morgan & Finnegan, LLP; Anthony V. S. England

[57] ABSTRACT

A Content Addressable Memory (CAM) includes a plurality of conventional CAM cells arranged in rows and columns, the CAM cells being coupled together by word lines and bit lines for reading from and writing information into the CAM cells. Each CAM cell in a row is connected to a match line which provides an indication when an input word on the bit lines matches the contents of the cells coupled to the match line. A combinatorial logic circuit including a parity generator is coupled to the word lines and provides an indication when multiple words have been selected by an input word. The combinatorial logic circuit includes an OR circuit providing a first input to an AND circuit and a parity generator providing a second input to the AND which only provides an output when multiple word lines have been selected by an input word.

6 Claims, 4 Drawing Sheets

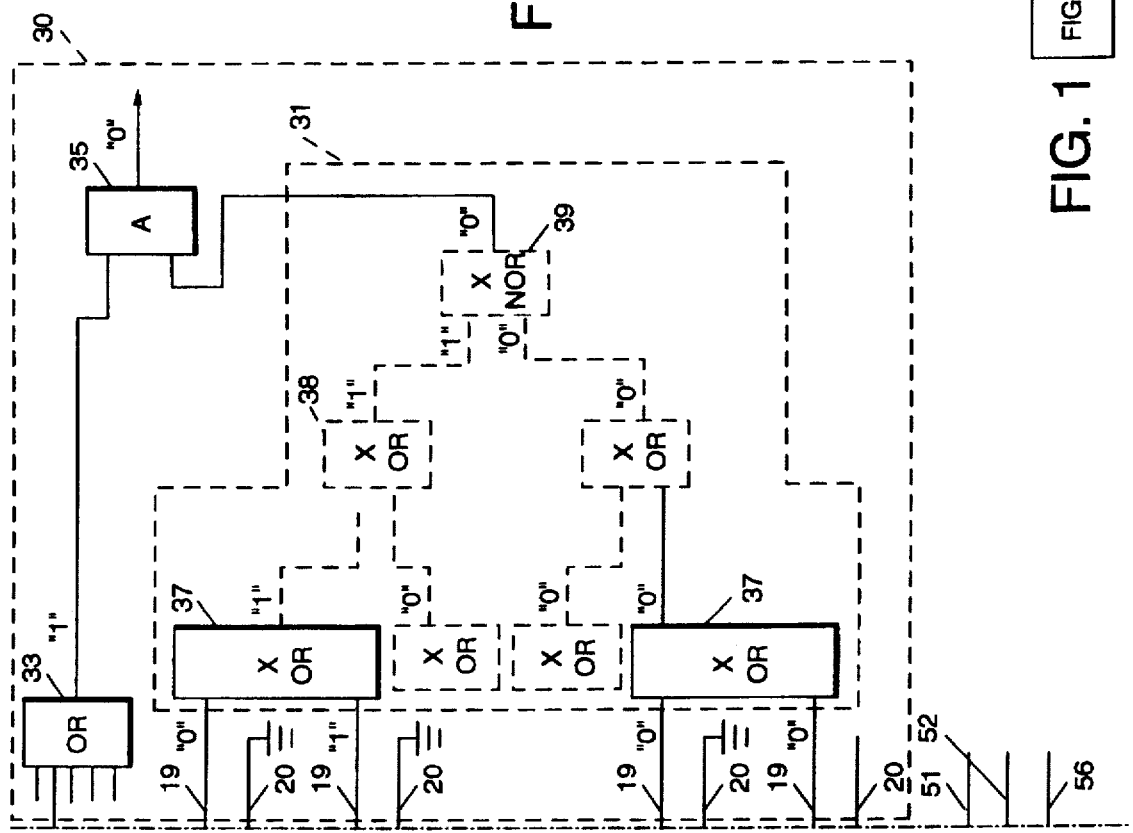

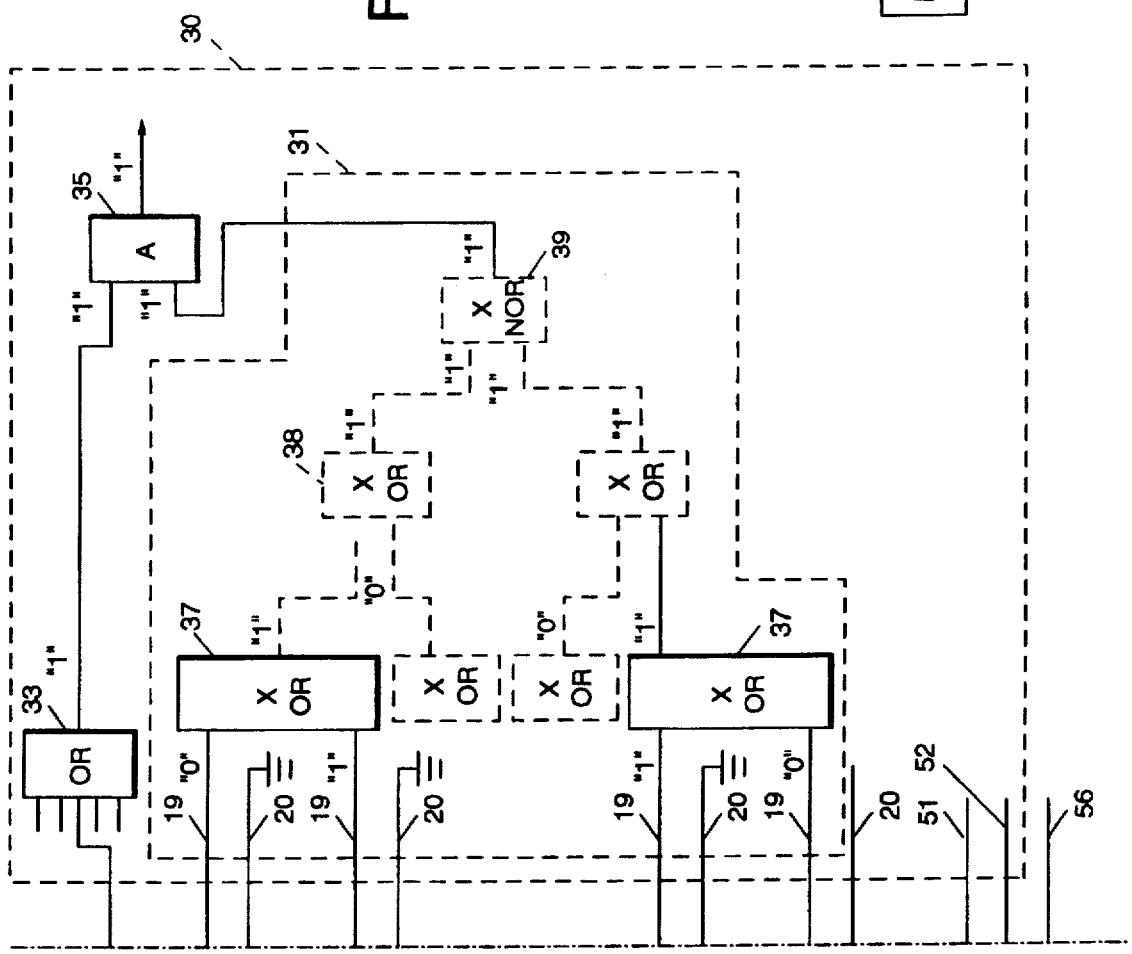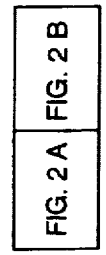

SELF-CHECKING CONTENT-ADDRESSABLE MEMORY AND METHOD OF OPERATION FOR DETECTING MULTIPLE SELECTED WORD LINES

BACKGROUND OF THE INVENTION

1. Field of Invention

This invention relates to content-addressable memories. More particularly, the invention relates to improved apparatus for and method of operating self-checking content-addressable memories for detecting multiple selected word lines.

2. Description of the Prior Art

Content addressable memories (CAM) comprise a plurality of RAM cells connected in an array of rows and columns and addressable by providing an input or word to the columns or bit lines. Each row has a match line and if a match is found between the data word, which is input and the contents of a row, then a signal is provided on the appropriate match line indicating the row where a match has been found. The data word which is input is normally applied to each row simultaneously. Normally, a match line for each row is pre-charged and the RAM cells in each row are arranged to discharge the match line if no match is found with a corresponding part of the input word. If any row in the CAM matches the input word, then a word line associated with that row is read out. Each row in the CAM generates a word line output when selected. If the CAM is operating normally, only one of the word lines will be selected or active. If it is desirable to detect an error when multiple words are selected by the input word, then there is a problem since the logic required to perform this check grows as the number of rows squared.

In such a case, when an input word selects multiple rows, an error condition arises for the CAM. The error condition is due to the conflict in the data between the words selected by the input word. It is desirable that a content-addressable memory be self-checking for multiple active word selections indicative of an error condition. It is further desirable that a self-checking content addressable memory utilize a minimum amount of logic to detect an error condition.

Prior art related to the problem addressed by the present invention is as follows:

U.S. Pat. No. 3,789,204 issued Jan. 29, 1974, discloses a self-checking digital storage system that detects errors arising from erroneous data and/or addresses. An odd parity is generated for an address of a given location, and an odd parity is generated for the data within the address location. The parity of the data is combined with the parity of the address in an exclusive-or and the resulting parity bit is written into memory. When information is accessed, the parity of the address is effectively subtracted from the parity of the data and a second exclusive-or yielding the data parity access. A check of the data priority access for the original data parity detects possible faults in the memory which could result in erroneous data or erroneous addresses.

U.S. Pat. No. 4,680,760, issued Jul. 14, 1987 disclose an apparatus for testing content-addressable memories, including means for storing the states for the match lines and further means for determining whether all match lines tested true.

U.S. Pat. No. 5,491,703, issued Feb. 13, 1996, filed Jun. 29, 1993 and having a foreign priority date of Jun. 30, 1992 discloses a content-addressable memory having a plurality of cells for storing a data word, at least one additional cell for storing a checking bit, and a match line for providing a signal to indicate when a match occurs between an input data word and the data stored in the row. The checking bit has a value dependent upon the content of the data word in accord with an error checking system. The input word and the input checking bit stored with the contents of each row are compared. When a mismatch occurs, the input data with the stored data word in two cells in that row are caused to change a signal level on a match line for that row whereby an access time for each associate operation is controlled to be less than that required for a single cell mismatch.

None of the prior art addresses the problem of identifying an error condition in a content-addressable memory when multiple word lines are selected by an input word. A solution to this problem which uses minimum logic elements and logic levels will enhance the utilization of content addressable memories in the art.

SUMMARY OF THE INVENTION

An object of the invention is an improved self-checking memory and method of operation for detecting an error condition.

Another object is a self-checking content-addressable memory (CAM) for detecting multiple selected word lines as an error condition.

Another object is a method of operating a self-checking content-addressable memory to detect an error condition upon selection of multiple word lines.

Another object is a content-addressable memory using minimum combinatorial logic for detecting multiple active word lines.

Another object is a content-addressable memory including a parity generator to detect multiple selected word lines.

These and other objects, features and advantages of the invention are achieved in a content-addressable memory having a plurality of CAM cells arranged in rows and columns, the CAM cells being coupled together by word lines and bit lines for reading from and writing information into the CAM cells. Each CAM cell in a row is connected to a match line which provides an indication when an input word on the bit lines matches the contents of the cells coupled to the match line. A combinatorial logic circuit including a parity generator is coupled to the word lines and provides an indication when multiple words have been selected by an input word. The combinatorial logic circuit includes an OR circuit providing a first input to an AND circuit and a parity generator providing a second input to the AND which only provides an output when multiple word lines have been selected by an input word.

DESCRIPTION OF THE DRAWING

The present invention will be more fully understood from the following detailed specification, taken in conjunction with the appended drawing, in which.

DESCRIPTION OF PREFERRED EMBODIMENT

Figure 1A:
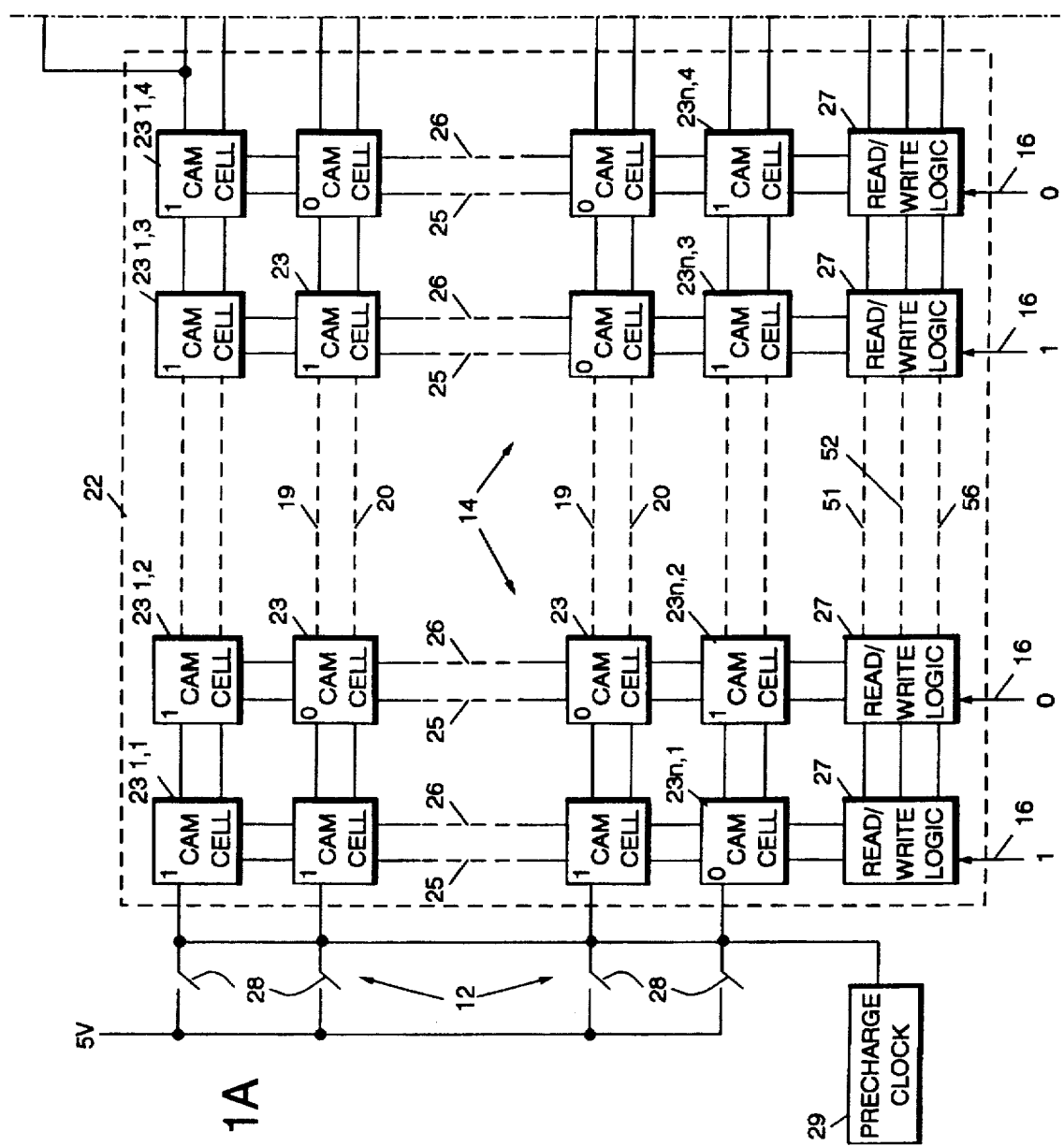
FIG. 1 is an assembly drawings of FIGS. 1A and 1B showing a block diagram of a Content Addressable Memory (CAM) incorporating the principles of the present invention in which only a single word is selected by an input word.

In FIG. 1, a content-addressable memory 22 includes a plurality of conventional CAM cells 23 arranged in a matrix of M rows 12 and N columns 14 in which M and N are any non-zero integer. The CAM cells in a row are coupled together by a word line 19 and a match line 20. All CAM cells in a column are coupled though lines 25, 26 to a read-write logic circuit 27 linked together by lines 51, 52 and 56. Each circuit 27 is coupled to an input output line 16 for reading data from and writing data into the memory 22. Each match line provides an output to indicate whether or not a match is found between a data word at input lines 16 with the contents of the cells in any of the rows 12. All match lines are connected through switches 28 controlled by a pre-charged clock 29 to a pre-charge voltage line. In this way, the match lines 20 may all be simultaneous pre-charged from the clock 29 when an associate operation is carried out by the read/write logic 27.

To detect an error condition in the array 22 when multiple word lines have been selected by the input word appearing at element 27, a combinatorial logic circuit 30 including a parity generator circuit 31 and a multiple OR circuit 33 provide inputs to an AND gate 35 to indicate an error condition when multiple word lines have been selected by an input word appearing on input lines 16. The OR circuit 33 is the Content Addressable Memory (CAM) hit detection circuit that is normally part of a standard CAM circuit and is not an additional circuit for implementing the invention. The parity generator includes conventional Exclusive-OR circuits 37 coupled to adjacent word lines as a first level of logic. Depending upon the number rows in the array, additional levels of second level Exclusive-OR circuits 38 are cascaded together to provide a single output from the parity generator in a conventional exclusive nor device 39 which provides a first input to conventional AND gate 35.

In FIG. 1, an input word 1010 is provided on the lines 16. The binary data contained in the CAM cells has been installed such that row 2 is the only row that matches the input words. In such case, row 2 provides an up or one level to the Exclusive-OR in the first level of Exclusive OR logic 37 and to the multiple OR 33. All other word lines provide a down or zero level to their respective first level Exclusive-OR 37 and to the multiple OR 33. The up or 1 level provided by row 2 ripples through the parity generator and appears at the input of the Exclusive-NOR 39 as an up or "1" bit. The other word lines propagate a down or zero bit through the parity generator to provide a down level or "0" bit at the input of the Exclusive-NOR 39. The unlike inputs to exclusive-nor provide a down level or "0" bit to the AND gate 35. Simultaneously, the up level or "1" bit provided by the selected row causes the OR gate 33 to provide an up level to the AND circuit 35 as a second input. The unlike inputs to AND gate 35 result in a zero or no output indicating a working array 22 without an error condition from multiple selected word lines.

Figure 2A:
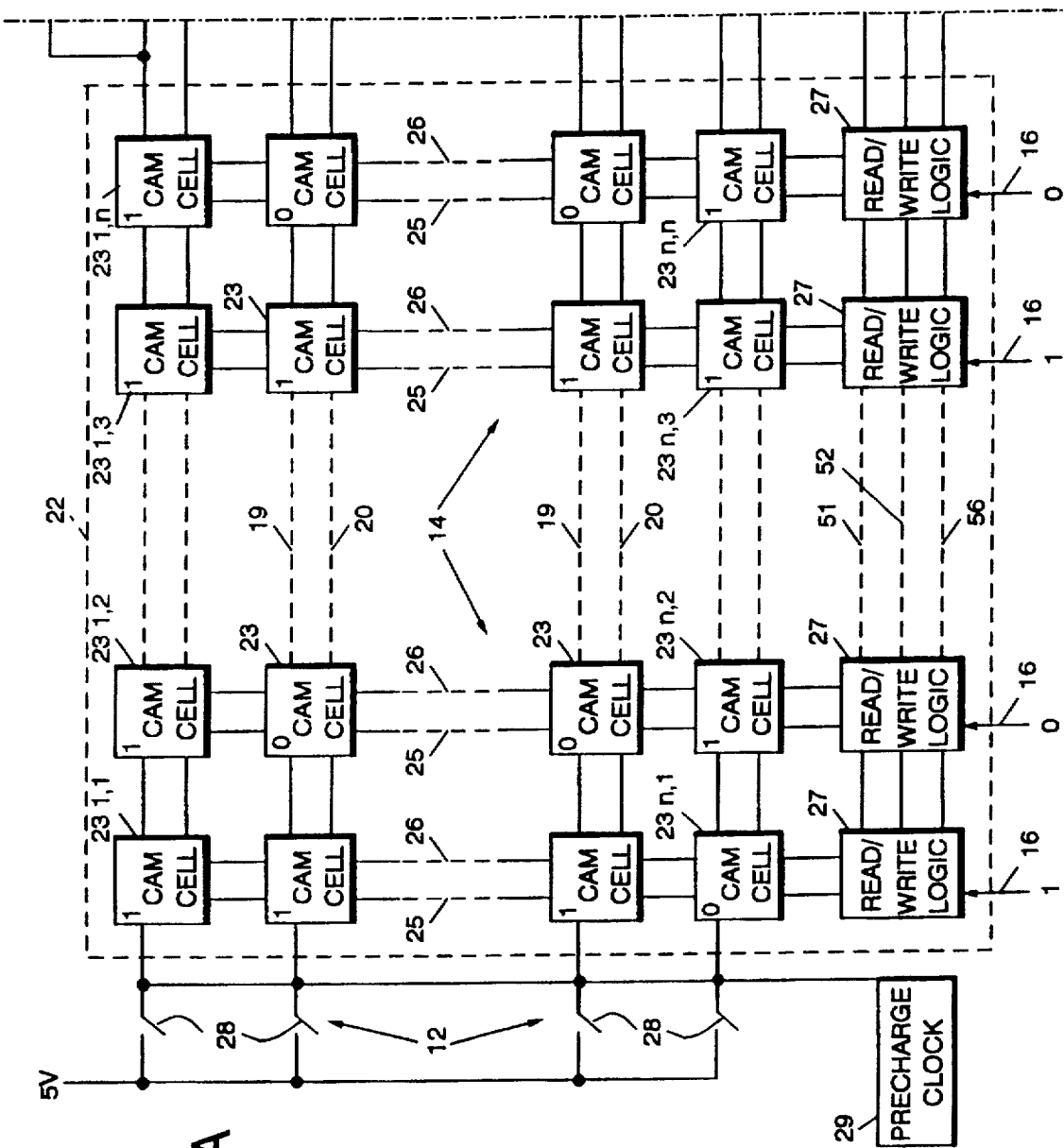
FIG. 2 is an assembly drawing of FIGS. 2A and 2B showing a block diagram of FIG. 1 in which multiple word lines have been selected by an input word.

In FIG. 2, the array 22 is arranged to have rows 2 and 3 contain the same word as appearing on input lines 16. The up levels or "1" bits propagated through the parity generator by the multiple selected word lines appear as a first input to the Exclusive-NOR 39 as an up level or "1" bit input. The non-selected word lines in the array propagate a down level or "0" bit through the parity generator which appear as a second up level input to the exclusive nor 39. The like first and second inputs at the exclusive nor 39 generate an up level or "1" bit as a first input to the AND gate 35. Likewise, the up levels or "1" bit provided by rows 2 and 3 to the OR gate 37 provide an up level as a second input to the AND gate 35. The output from AND gate 35 is an up one or level indicating multiple selected word lines as an error condition in the array 22. Since the method of the invention is based on parity, it will not detect errors in the CAM that result in an odd number of word lines being on (3,5,7). However, for this to occur there would have to be errors in multiple rows within the CAM that resulted in those multiple rows having the same address as some other entry within the CAM which is not very likely to occur.

In the prior art, parity generator size for multiple word detection is normally proportional to the number of bits being checked and their delay is proportional to Log n where n is the number of logic levels in the parity generator. Assuming 32 word lines, a prior art solution would require 32 units of 32 way AND gates and a 32 way OR gate. Further assuming a four bit word input to the array, the detection of multiple selected words would require of the order of 350 gates and about 6 levels of logic. In contrast, the present invention requires only 30 units of two input Exclusive-ORs in four levels of logic and one Exclusive-NOR in a fifth level of logic.

In summary, an error condition in the array 22 is indicated by AND 35 only when multiple word lines have been selected by the input word. For the condition where only a single word line has been selected in the array 22, a down level or no output from AND gate 35 indicates a working array 22 without an error condition for multiple selected word lines. The array is self-checking for multiple selected word lines. The combinatorial logic comprises a minimum number of levels, the number of levels depending upon the number of rows in the array.

While the invention has been described in a specific embodiment, various modifications may be made without departing from the spirit and scope of the invention as defined in the appended claims:

I claim:

1. A self-checking content addressable memory for detecting multiple selected word lines comprising:

a) an array of content addressable memory cells in "m" rows and "n" columns where "m" and "n" are positive integers;

b) means coupled to the columns as bit lines for writing information into and reading information from content addressable memory cells in a selected row as a word line in "write" and "read" operations, respectively; and c) means coupled to multiple word lines indicating when the multiple word lines have been selected in reading information from the array in a "read" operation.

2. The self-checking content addressable memory of claim 1 wherein the means coupled to the word lines includes a parity checker and combinatorial logic circuit for indicating when multiple word lines have been selected in a "read" operation.

3. The self-checking content addressable memory of claim 2 wherein the parity checker is an "odd" parity checker and the combinatorial logic circuit includes an "OR" circuit providing a first input and the parity checker providing a second input to an "AND" circuit, the output of the "AND" circuit indicating when multiple word lines have been selected in a "read" operation.

4. The self-checking content addressable memory of claim 3 wherein the parity checker comprises a plurality of Exclusive-ORs, in cascade relation, the last Exclusive-OR providing an inverted output signal.

5. The self-checking content addressable memory of claim 3 wherein the parity generator comprises a plurality of Exclusive-ORs, in cascade relation and terminating in an Exclusive-Nor providing an even parity output indication.

6. In a self-checking content addressable memory comprising an array of content addressable memory cells in "m"

rows and "n" columns where "m" and "n" are any non-zero integer and means coupled to the columns as bit lines for writing information into and reading information from the content addressable memory cells in a selected row as a word line in a "write" and "read" operations, respectively, a method for detecting multiple selected word lines in a "read" operation, comprising the steps of:

a) providing an input to the array to select a word line;

b) sensing multiple word lines in a parity checker and combinatorial logic circuit both coupled to the word lines; and c) providing an output at the combinatorial logic circuit only when multiple word lines have been selected in the "read" operation.

* * * * *